United States Patent
Lee et al.

(10) Patent No.: US 7,170,355 B2
(45) Date of Patent: Jan. 30, 2007

(54) VOLTAGE-CONTROLLED OSCILLATOR USING CURRENT FEEDBACK NETWORK

(75) Inventors: Ja Yol Lee, Daejeon-shi (KR); Sang Heung Lee, Daejeon-shi (KR); Jin Yeong Kang, Daejeon-shi (KR); Seung Hyeub Oh, Daejeon-shi (KR)

(73) Assignee: Electronics and Telecommunications Research Institute, Daejeon-shi (KR)

( * ) Notice: Subject to any disclaimer, the term of this patent is extended or adjusted under 35 U.S.C. 154(b) by 67 days.

(21) Appl. No.: 10/957,749

(22) Filed: Oct. 5, 2004

(65) Prior Publication Data

US 2005/0156682 A1    Jul. 21, 2005

(30) Foreign Application Priority Data

Dec. 24, 2003   (KR) ..................... 10-2003-0096029

(51) Int. Cl.
   *H03B 1/00*   (2006.01)
(52) U.S. Cl. ............................. 331/117 R; 331/177 V
(58) Field of Classification Search ............ 331/117 R, 331/177 V
   See application file for complete search history.

(56) References Cited

U.S. PATENT DOCUMENTS 6,545,554 B1 *  4/2003  Rozenblit et al. ....... 331/117 R
6,624,709 B2 *  9/2003  Hiroshima et al. ..... 331/177 V
6,717,482 B2 *  4/2004  Sato et al. ................. 331/154

FOREIGN PATENT DOCUMENTS

KR      2000-18545     10/2000

OTHER PUBLICATIONS

Yeom Kyung-Whan; Design and fabrication of the surface mountable VCO operating at 3V for PCS handset; Thesis 96-21-3-24; Thesis No. 96037-0202; Chungnam Univ.; Feb. 2, 1996.
Ulrich L. Rohde; Nonlinear Effects In Oscillators and Synthesizers (Invited); 2001 IEEE MTT-S Digest; 0-7803-6538-0/01/$10.00 © 2001 IEEE.
Lee et al., "An 1.8 GHz voltage-controlled oscillator using current-current negative feedback network", 6th European Conference on Wireless Technology, Oct. 2004, pp. 113-116.

* cited by examiner

*Primary Examiner*—Joseph Chang
(74) *Attorney, Agent, or Firm*—Mayer Brown Rowe & Maw LLP

(57) ABSTRACT

Provided is a voltage-controlled oscillator (VCO) using a current feedback network for use in a wireless communication terminal. The voltage-controlled oscillator has high input impedance and low output impedance, so that a degree of isolation from the external load is excellent, thereby preventing degradation of the Q-factor by the load in overall oscillation circuit. In the voltage-controlled oscillator of the present invention, an LC resonator is provided to generate positive feedback, and negative resistance may be obtained at a wider frequency range by tuning a varactor of the LC resonator. And a boosting inductor is inserted into the positive feedback loop to have a greater negative resistance, therefore it is possible to prevent a problem in which the oscillation does not occur due to the parasitic resistance components generated during circuit fabrication.

16 Claims, 5 Drawing Sheets

US 7,170,355 B2

VOLTAGE-CONTROLLED OSCILLATOR USING CURRENT FEEDBACK NETWORK

BACKGROUND

1. Field of the Invention

The present invention relates to a voltage-controlled oscillator (VCO) and, more particularly, to a voltage-controlled oscillator using a current feedback network.

2. Discussion of Related Art

The voltage-controlled oscillator is a component used as a local oscillator in many wireless communication devices. As a conventional voltage-controlled oscillator, there are a Collpits oscillator that uses capacitor feedback, a Hartley oscillator that uses inductor feedback, and a Clapp oscillator that modifies the Collpits oscillator in terms of frequency stability.

Among these, the Hartley oscillator is in need of an inductor with a high Q-factor so that it is rarely used as a commercial product, while the Clapp oscillator and the Collpits oscillator are widely and commercially used due to good frequency stability and easy frequency tuning.

The Clapp oscillator and the Collpits oscillator generate negative resistance using the capacitor feedback. Therefore, due to a parasitic resistance component or a resistance component of the capacitor accompanied at the time of fabricating an oscillator circuit, the negative resistance may not be generated. Recently, in the commercial VCO products, a buffer is connected to an output of the Collpits oscillator or the Clapp oscillator to increase output power and improve a degree of isolation from the external load, thereby preventing degradation of the quality factor in the VCD circuit. However, when the buffer is connected to the output, the circuit becomes complicated so that a problem occurs that unpredictable parasitic components grow larger. Therefore, due to the unpredictable parasitic components, the oscillation may not be made at a designed frequency or the oscillation may not be made at all, which leads to a cumbersome task of tuning capacitors, resistors or inductors. It takes another time and money so that it is difficult to reduce the cost. Furthermore, since the tuning task cannot be performed in a semiconductor integrated circuit, yield is significantly reduced.

SUMMARY OF THE INVENTION

The present invention is directed to a voltage-controlled oscillator using a current feedback network insensitive to parasitic components, which are inevitably generated during circuit fabrication, and with the least phase noise caused by a load.

The present invention is also directed to a voltage-controlled oscillator using a current feedback network that acts as a buffer to the external load without employing an additionally separate buffer while problems that the oscillation is not made at a desired frequency or the oscillation is not made at all due to parasitic resistance components, which are generated during circuit fabrication, are addressed.

The present invention is also directed to a voltage-controlled oscillator using a current feedback network that suppresses the low-frequency noise such as 1/f noise to degrade the phase noise of a voltage-controlled oscillator.

According to a first aspect of the present invention, there is provided a voltage-controlled oscillator using a current feedback network, comprising: a first transistor; a second transistor having a base connected to an emitter of the first transistor and a collector connected to a base of the first transistor; a varactor connected to the emitter of the first transistor and a ground; an inductor connected to the emitter of the first transistor and the ground; and a resistor connected to the collector of the second transistor and a voltage source, wherein a collector of the first transistor and the voltage source are short-circuited, and wherein an emitter of the second transistor and the ground are short-circuited.

According to a second aspect of the present invention, there is provided a voltage-controlled oscillator using a current feedback network, comprising: a first transistor; a second transistor having a base connected to an emitter of the first transistor and a collector connected to a base of the first transistor; a capacitor connected to the emitter of the first transistor and a ground; a first resistor connected to the emitter of the first transistor and the ground; and a second resistor connected to the collector of the second transistor and a voltage source, wherein a collector of the first transistor and the voltage source are short-circuited, and wherein an emitter of the second transistor and the ground are short-circuited.

According to a third aspect of the present invention, there is provided a voltage-controlled oscillator using a current feedback network, comprising: a first transistor; a second transistor having a base connected to an emitter of the first transistor and a collector connected to a base of the first transistor; a first varactor connected to the emitter of the first transistor and a ground; a first resistor connected to the emitter of the first transistor and the ground; a second varactor connected to a collector of the first transistor and a voltage source; an inductor resistor connected to the collector of the first transistor and the voltage source; and a second resistor connected to the collector of the second transistor and the voltage source, wherein an emitter of the second transistor and the ground are short-circuited.

According to a fourth aspect of the present invention, there is provided a voltage-controlled oscillator using a current feedback network, comprising: a first transistor; a second transistor having a base connected to an emitter of the first transistor and a collector connected to a base of the first transistor; a first varactor connected to the emitter of the first transistor and a ground; a resistor connected to the emitter of the first transistor and the ground; a second varactor connected to the collector of the second transistor and a voltage source; and an inductor resistor connected to the collector of the second transistor and the voltage source, wherein a collector of the first transistor and the voltage source are short-circuited, and wherein an emitter of the second transistor and the ground are short-circuited.

According to a fifth aspect of the present invention, there is provided a voltage-controlled oscillator using a current feedback network, comprising: an LC tank connected to a voltage source; a first transistor having a collector connected to the LC tank; a second transistor having a base connected to an emitter of the first transistor and a collector connected to a base of the first transistor and the LC tank; a first capacitor connected to the emitter of the first transistor and a ground; a first resistor connected to the emitter of the first transistor and the ground; a first inductor connected to the emitter of the second transistor and the ground; a third transistor having a collector connected to the LC tank; a fourth transistor having a base connected to an emitter of the third transistor and a collector connected to a base of the third transistor and the LC tank; a second capacitor connected to the emitter of the third transistor and a ground; a second resistor connected to the emitter of the third transistor and the ground; a second inductor connected to the emitter of the fourth transistor and the ground; and varactors connected to the collectors of the first transistor and the second transistor.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

The preferred embodiments of the present invention will now be described with reference to the accompanying drawings. A variety of modification may be made herein, but it should be not construed that the present invention is limited hereto. The preferred embodiments of the present invention will be provided for thorough understanding of the present invention to those skilled in the art.

Figure 1:
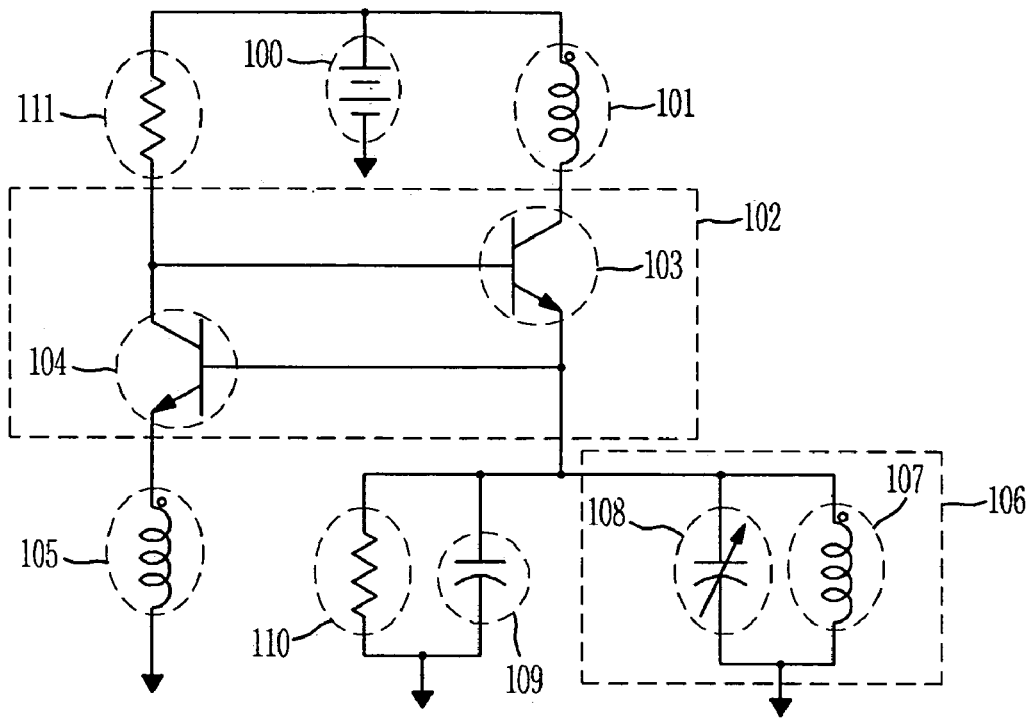
FIG. 1 is a diagram showing a voltage-controlled oscillator using a current feedback network according to a first embodiment of the present invention.

FIG. 1 is a diagram showing a voltage-controlled oscillator using a current feedback network according to a first embodiment of the present invention.

In FIG. 1, the voltage-controlled oscillator using the current feedback network is comprised of a first transistor 103 and a second transistor 104 connected to each other to form a feedback loop, an LC tank 106, a capacitor 109 and a first resistor 110 connected to an emitter of the first transistor 103, a first inductor 105 connected to an emitter of the second transistor 104, a second inductor 101 connected to a collector of the first transistor 103, a second resistor 111 connected to a collector of the second transistor 104, and a voltage source 100 connected to the second inductor 101 and the second resistor 111. Further, the LC tank 106 is comprised of a third inductor 107 and a varactor 108.

A part of the emitter current of the first transistor 103 is sampled by a first resistor 110 and fed back into a base input port of the second transistor 104 through a parallel RLC resonant circuit 106, 109 and 110. This configuration in which the current is fed back is referred to as current-current negative feedback. Here, a reference numeral 102 indicates a loop along which the current is fed back. In general, the feedback loop is a negative feedback network if the feedback network is composed of only resistors, but it is possible for the loop to be a positive feedback network if a phase-shifting element such as a capacitor or inductor is included in the feedback network. In the voltage-controlled oscillator using the current feedback network, the first transistor 103, the second transistor 104, the capacitor 109, and the varactor 108 forms the positive feedback loop to generate a negative resistance. The second transistor 104 amplifies the voltage locally generated by the capacitor 109 and the varactor 108, so that a larger voltage is fed back and the negative resistance becomes larger. In addition, a frequency range where the negative resistance is generated may be tuned by adjusting a value of the varactor 108. Also, in the voltage-controlled oscillator using the current feedback network, the first resistor 110 samples the low-frequency noise such as 1/f noise, and the sampled low-frequency noise is feedback to the base of the first transistor 103 through the second transistor 104. The low-frequency noise source at the base of the first transistor 103 is cancelled by the feedback low-frequency noise, and then the phase noise of a voltage-controlled oscillator using current feedback network is improved. The emitter of the first transistor 103 may be connected only to the LC tank 106, or only to the capacitor 109 and the first resistor 110, or only to the capacitor 109, the first resistor 110 and the varactor 108. The second inductor 101 connected to the collector of the first transistor 103 is an RF choke inductor. When it is not necessary to use the RF choke, a resistor may take the place of the RF choke, or the inductor may be omitted. In other words, the voltage source and the collector of the first transistor 103 are short-circuited. A voltage of the first inductor 105 is in phase with the voltage positively fed back by the capacitor 109 and the varactor 108, thereby obtaining a fast transient response and a large output. The first inductor 105 is also referred to as a boosting inductor. However, the first inductor 105 may be omitted. In other words, the ground and the emitter of the second transistor 104 are short-circuited. When an output is made at the emitter of the first transistor 103, there appear high input impedance and low output impedance. Therefore, the voltage-controlled oscillator using the current feedback network may serve as a buffer to make smaller the effect of the load onto the inside of the oscillator. Further, when the larger output power is required, the output may be made at the collector or the base of the first transistor 103.

Figure 2:
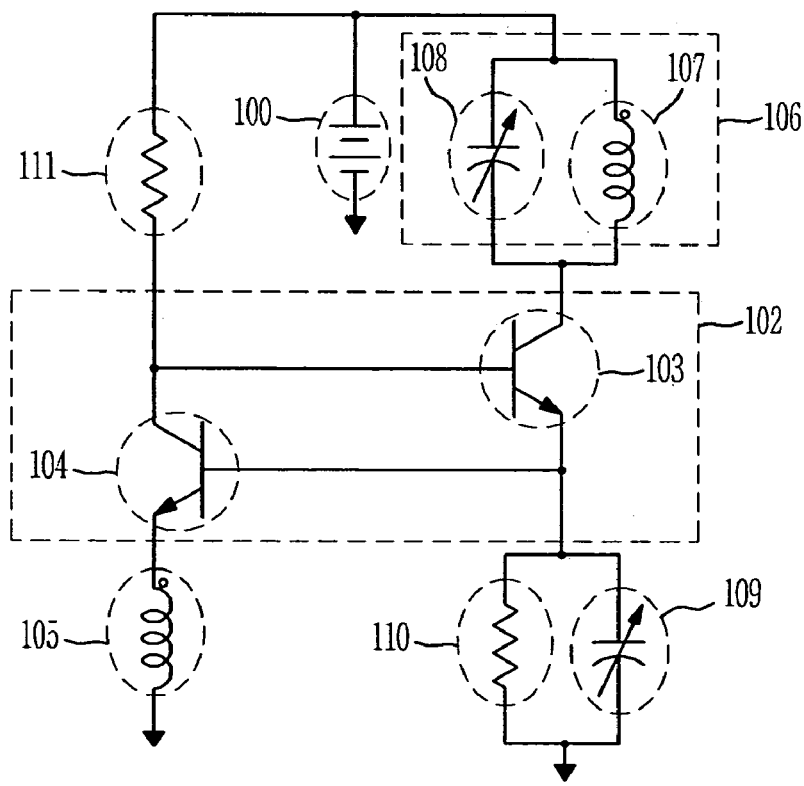
FIG. 2 is a diagram showing a voltage-controlled oscillator using a current feedback network according to a second embodiment of the present invention.

FIG. 2 is a diagram showing a voltage-controlled oscillator using a current feedback network according to a second embodiment of the present invention.

In FIG. 2, the voltage-controlled oscillator using the current feedback network is comprised of a first transistor 103 and a second transistor 104 connected to each other to form a feedback loop, a first varactor 109 and a first resistor 110 connected to an emitter of the first transistor 103, a first inductor 105 connected to an emitter of the second transistor 104, an LC tank 106 connected to a collector of the first transistor 103, a second resistor 111 connected to a collector of the second transistor 104, and a voltage source 100 connected of the LC tank 106 and the second resistor 111.

Further, the LC tank 106 is comprised of a second inductor 107 and a second varactor 108.

The voltage-controlled oscillator in FIG. 2 is different from that of FIG. 1 just in that the LC tank is arranged to the collector of the first transistor, and the emitter of the first transistor is connected to the first varactor, while the working principles are substantially the same. In FIG. 2, the first inductor 105 leads to a fast transient response and a larger output. However, the first inductor 105 may be omitted. In other words, the ground and the emitter of the second transistor 104 are short-circuited.

Figure 3:
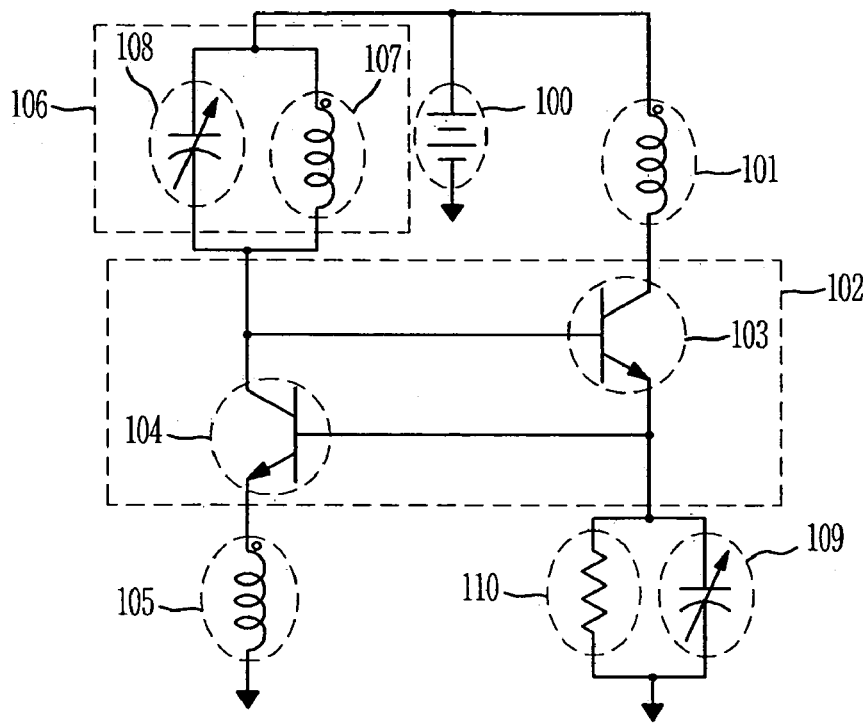
FIG. 3 is a diagram showing a voltage-controlled oscillator using a current feedback network according to a third embodiment of the present invention.

FIG. 3 is a voltage-controlled oscillator using a current feedback network according to a third embodiment of the present invention.

In FIG. 3, the voltage-controlled oscillator using the current feedback network is comprised of a first transistor 103 and a second transistor 104 connected to each other to form a feedback loop, a first varactor 109 and a first resistor 110 connected to an emitter of the first transistor 103, a first inductor 105 connected to an emitter of the second transistor 104, a second inductor 101 connected to a collector of the first transistor 103, an LC tank 106 connected to a collector of the second transistor 104, and a voltage source 100 connected of the LC tank 106 and the second inductor 101. Further, the LC tank 106 is comprised of a third inductor 107 and a second varactor 108.

The voltage-controlled oscillator in FIG. 3 is different from that of FIG. 1 just in that the LC tank is arranged to the collector of the second transistor, and the emitter of the first transistor is connected to the first varactor, while the working principles are substantially the same. In FIG. 3, the second inductor 101 connected to the collector of the first transistor 103 is an RF choke inductor. When it is not necessary to use the RF choke, a resistor may take the place of the RF choke, or the inductor may be omitted. In other words, the voltage source and the collector of the first transistor 103 are short-circuited. In addition, the first inductor 105 leads to a fast transient response and a larger output. However, the first inductor 105 may be omitted. In other words, the ground and the emitter of the second transistor 104 are short-circuited.

Figure 4:
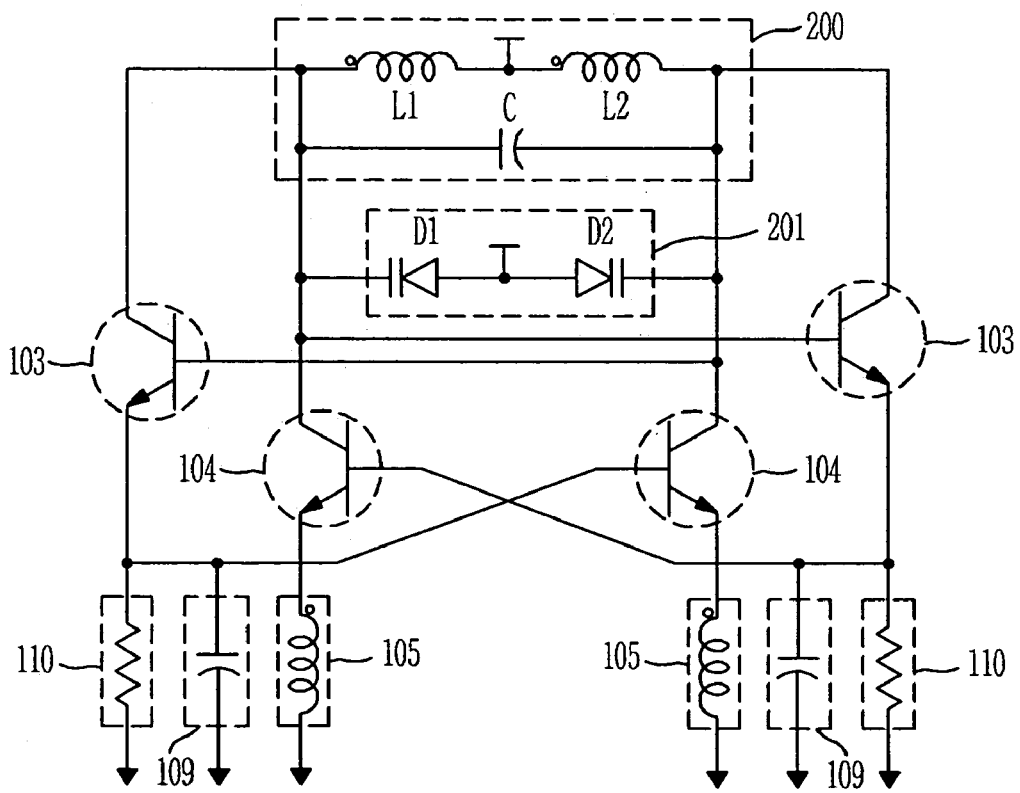
FIG. 4 is a diagram showing a fully differential voltage-controlled oscillator using a current feedback network according to a fourth embodiment of the present invention.

FIG. 4 is a fully differential voltage-controlled oscillator using a current feedback network according to a fourth embodiment of the present invention.

An LC tank 200 has a first and second inductors L1 and L2 connected to a voltage source, respectively, and a capacitor C connected to the first and second inductors L1 and L2. A first transistor 103 and a second transistor 104 are connected to each other to form a feedback loop. Collectors of the first transistor 103 and second transistor 104 are connected to the LC tank 200, respectively. A base of the first transistor 103 is connected to the collector of the second transistor 104, and a base of the second transistor 104 is connected to an emitter of the first transistor 103. A capacitor 109 and a resistor 110 are connected to the emitter of the first transistor 103 and a ground. An inductor 105 is connected to an emitter of the second transistor 104 and the ground. Varactor 201 having two varactor diodes D1 and D2 is connected to the collector of the first transistor 103 and the collector of the second transistor 104.

The same feedback loop 102 in the fully differential voltage-controlled oscillator is differentially connected through the LC-tank 200.

Figure 5:
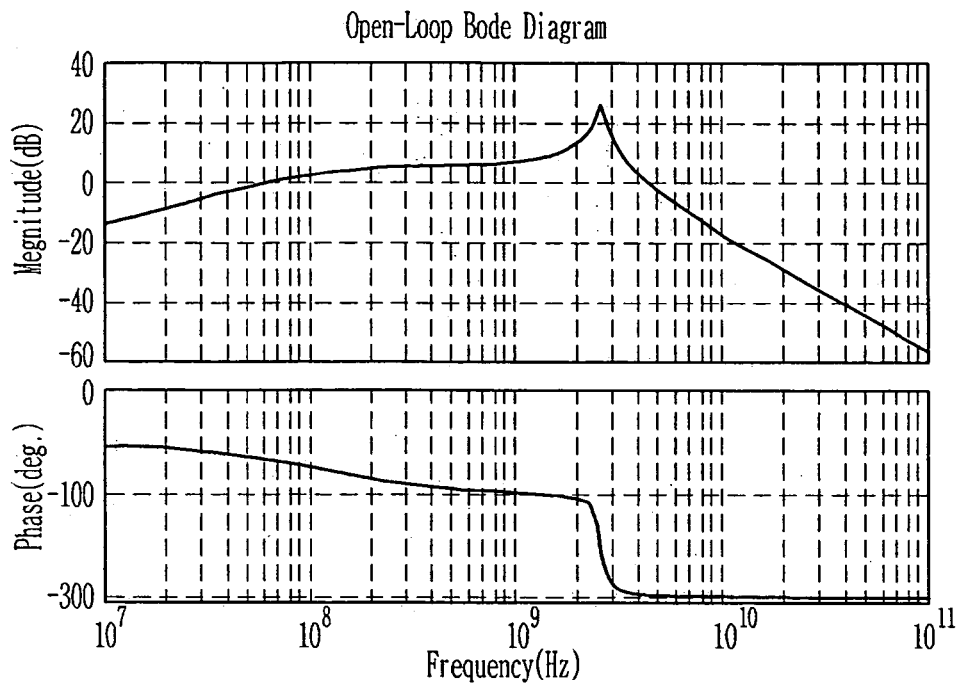
FIG. 5 is a Bode diagram for a voltage-controlled oscillator using a current feedback network according to a first embodiment of the present invention.

The fully differential voltage-controlled oscillator in FIG. 4 is different from that of FIG. 3 just in that the same feedback loop 102 is connected through the LC tank 200, and each collector of the first transistor 103 and the second transistor 104 is connected to the varactor 201 and the capacitor of the LC tank 200, while the working principles are substantially the same. In FIG. 4, the inductor 105 leads to a fast transient response and a larger output. However, the inductor 105 may be omitted. In other words, the ground and the emitter of the second transistor 104 are short FIG. 5 is a Bode diagram for a voltage-controlled oscillator using a current feedback network according to a first embodiment of the present invention. In FIG. 5, it may be understood that the oscillation is made at a frequency of 1.8 GHz where the magnitude is greater than 0 dB and its phase crosses −180°.

Figure 6:
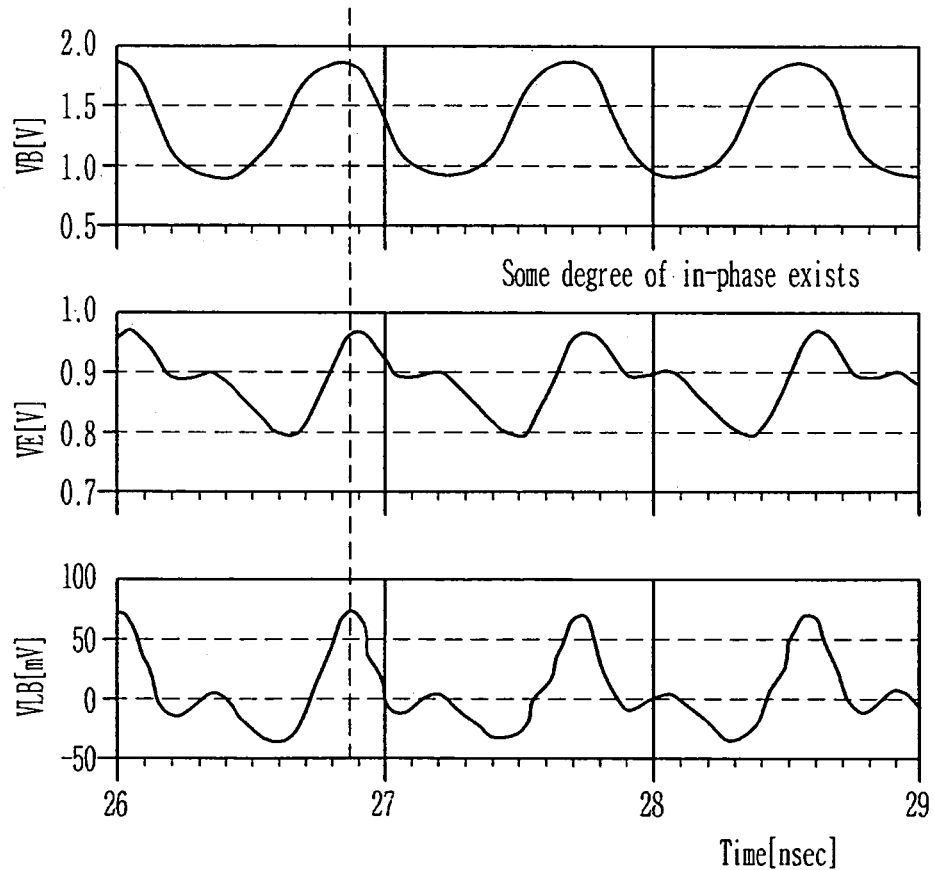
FIG. 6 is a diagram showing a change over time in a base voltage VB and an emitter voltage VE of a first transistor and an emitter voltage VLB of a second transistor shown in FIG. 1.

FIG. 6 is a diagram showing a change over time in a base voltage VB and an emitter voltage VE of the first transistor and an emitter voltage VLB of the second transistor shown in FIG. 1. In FIG. 6, it may be understood that the respective voltages are in phase.

Figure 7:
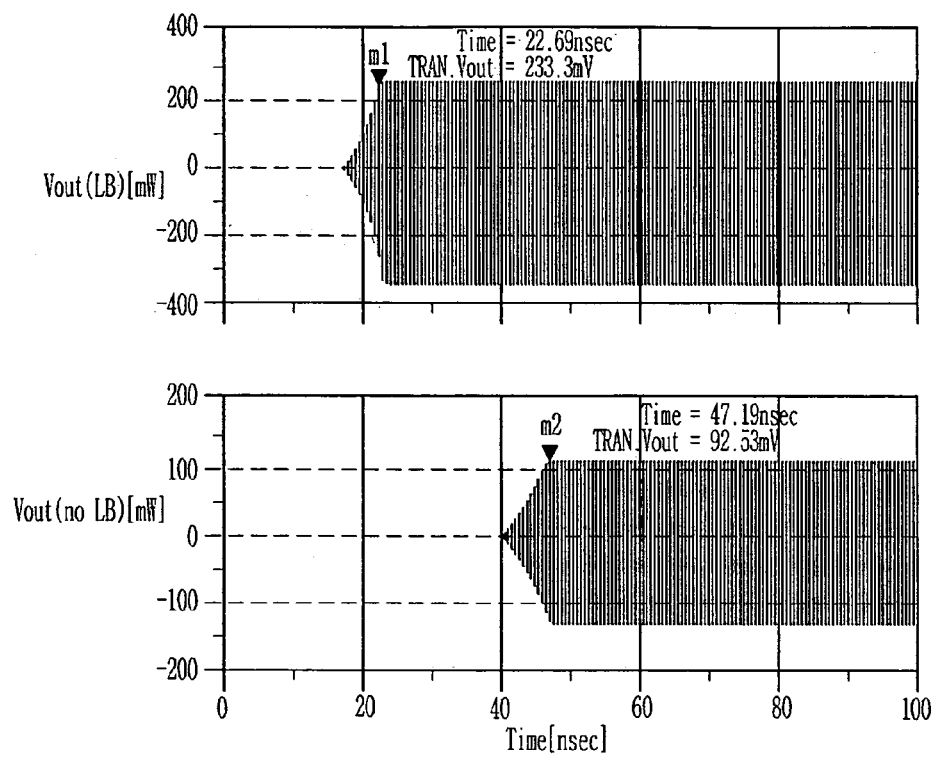
FIG. 7 is a diagram showing a simulation result of a transient response of an output voltage Vout (LB) with a boosting inductor and an output voltage Vout (no LB) without a boosting inductor shown in FIG. 1.
Figure 8:
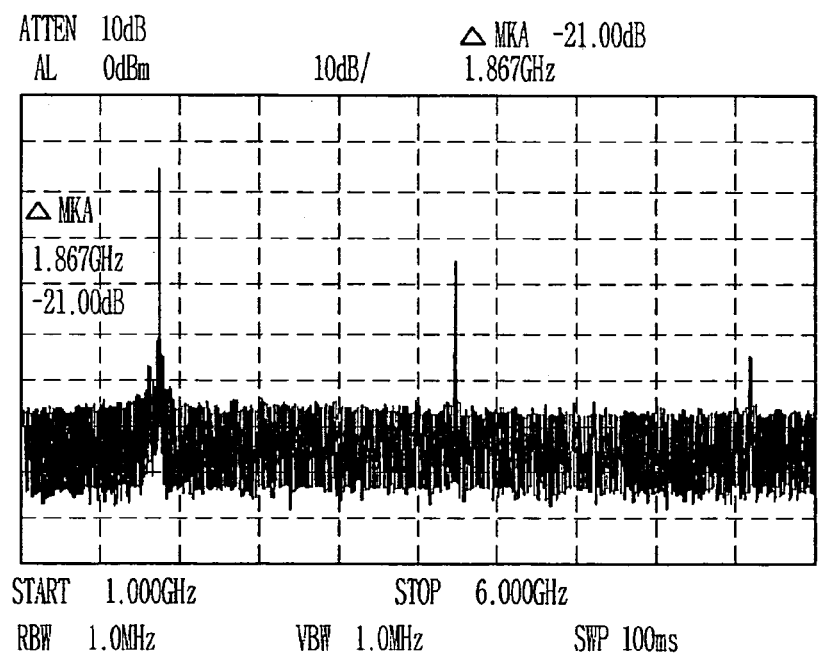
FIG. 8 is a diagram showing a measured output frequency spectrum of a voltage-controlled oscillator using a current feedback network according to a first embodiment of the present invention.

FIG. 7 is a diagram showing a simulation result of a transient response of an output voltage Vout (LB) with a boosting inductor and an output voltage Vout (no LB) without a boosting inductor. In FIG. 7, it may be appreciated that the fast response and larger voltage waveform may be obtained with the boosting inductor, FIG. 8 is a diagram showing a measured output frequency spectrum of a voltage-controlled oscillator using a current feedback network according to a first embodiment of the present invention. In FIG. 8, it may be appreciated that the oscillation frequency is 1867 MHz.

Figure 9:
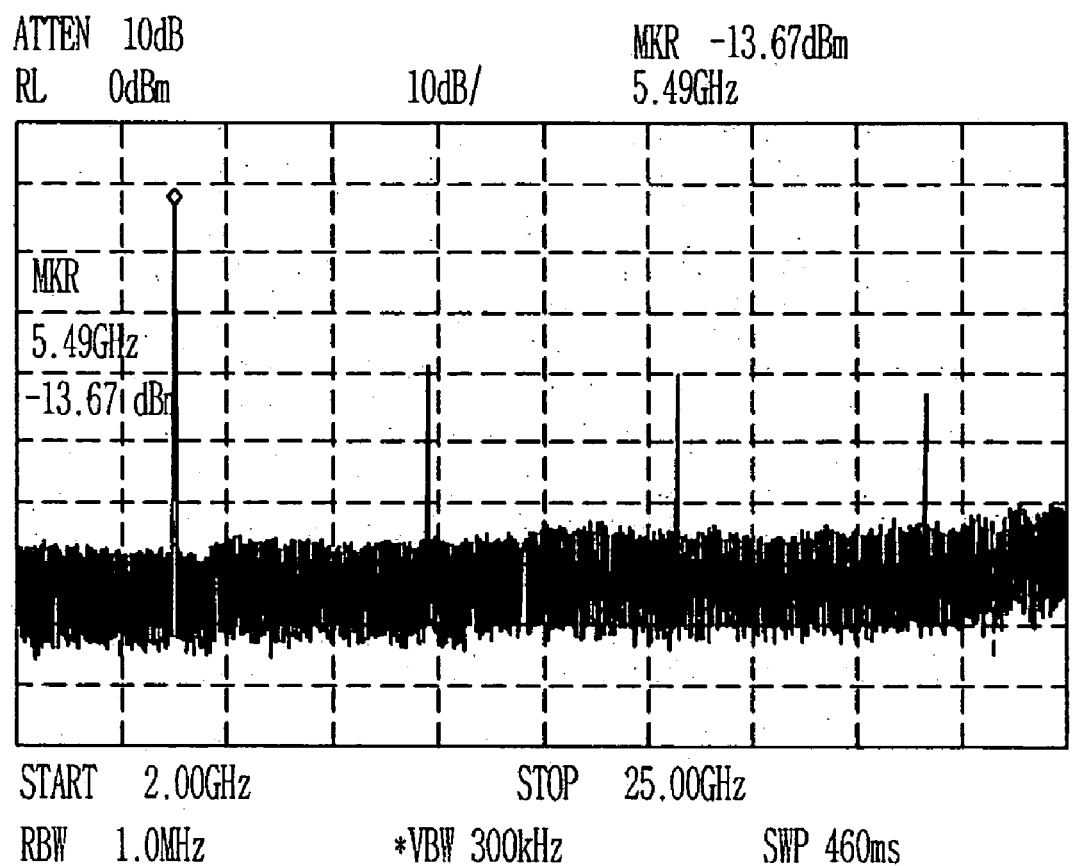
FIG. 9 is a diagram showing a measured output frequency spectrum of a fully differential voltage-controlled oscillator using a current feedback network according to a fourth embodiment of the present invention.

FIG. 9 is a diagram showing a measured output frequency spectrum of a fully differential voltage-controlled oscillator using a current feedback network according to a fourth embodiment of the present invention. In FIG. 9, it may be appreciated that the oscillation frequency is 5490 MHz.

According to a voltage-controlled oscillator using a current feedback network of the present invention, an amplifier with a boosting inductor is included in a positive feedback loop, so that the voltage-controlled oscillator becomes insensitive to the parasitic components generated during circuit fabrication.

Further, according to a voltage-controlled oscillator using a current feedback network of the present invention, a low-frequency noise source of the first transistor is suppressed by the feedback loop, thereby reducing the phase noise of the voltage-controlled oscillator using a current feedback network.

Further, according to a voltage-controlled oscillator using a current feedback network of the present invention, a negative resistance may be obtained at a desired frequency by a varactor having a feedback loop, thereby enabling frequency tuning after circuit fabrication.

Further, according to a voltage-controlled oscillator using a current feedback network of the present invention, the current feedback network is used so that a degree of isolation from the external load is higher and the impact of the load onto the oscillator core may be buffered.

While the preferred embodiments have been described, these embodiments are for illustration only, and not for limitation of the present invention. Those skilled in the art will appreciate that a variety of modifications, changes, and adjustments may be made without departing from the spirit of the present invention. Therefore, the scope of the present invention is only limited by the attached claims, and should be construed to include afore-mentioned modifications, changes and adjustments.

What is claimed is:

1. A voltage-controlled oscillator using a current feedback network, comprising:

a first transistor;

a second transistor having a base directly connected to an emitter of the first transistor and a collector connected to a base of the first transistor;

a varactor connected to the emitter of the first transistor and a ground;

an inductor connected to the emitter of the first transistor and the ground; and a resistor connected to the collector of the second transistor and a voltage source, wherein the voltage source and a collector of the first transistor are short-circuited, and wherein the ground and an emitter of the second transistor are short-circuited.

2. The voltage-controlled oscillator according to claim 1, wherein the collector of the first transistor and the voltage source are connected through an inductor.

3. The voltage-controlled oscillator according to claim 1, wherein the collector of the first transistor and the voltage source are connected through a resistor.

4. The voltage-controlled oscillator according to claim 1, wherein the emitter of the second transistor and the ground are connected through an inductor.

5. The voltage-controlled oscillator according to claim 1, wherein an output is made at the emitter, the collector or the base of the first transistor.

6. A voltage-controlled oscillator using a current feedback network, comprising:

a first transistor;

a second transistor having a base directly connected to an emitter of the first transistor and a collector connected to a base of the first transistor;

a capacitor connected to the emitter of the first transistor and a ground;

a first resistor connected to the emitter of the first transistor and the ground; and a second resistor connected to the collector of the second transistor and a voltage source, wherein a collector of the first transistor and the voltage source are short-circuited, and wherein an emitter of the second transistor and the ground are short-circuited.

7. The voltage-controlled oscillator according to claim 6, further comprising a varactor connected to the emitter of the first transistor and the ground.

8. The voltage-controlled oscillator according to claim 6, wherein the collector of the first transistor and the voltage source are connected through an inductor.

9. The voltage-controlled oscillator according to claim 6, wherein the emitter of the second transistor and the ground are connected through an inductor.

10. A voltage-controlled oscillator using a current feedback network, comprising:

a first transistor;

a second transistor having a base directly connected to an emitter of the first transistor and a collector connected to a base of the first transistor;

a first varactor connected to the emitter of the first transistor and a ground;

a first resistor connected to the emitter of the first transistor and the ground;

a second varactor connected to a collector of the first transistor and a voltage source;

an inductor connected to the collector of the first transistor and the voltage source; and a second resistor connected to the collector of the second transistor and the voltage source, wherein an emitter of the second transistor and the ground are short-circuited.

11. The voltage-controlled oscillator according to claim 10, wherein the emitter of the second transistor and the ground are connected through an inductor.

12. A voltage-controlled oscillator using a current feedback network, comprising:

a first transistor;

a second transistor having a base directly connected to an emitter of the first transistor and a collector connected to a base of the first transistor;

a first varactor connected to the emitter of the first transistor and a ground;

a resistor connected to the emitter of the first transistor and the ground;

a second varactor connected to the collector of the second transistor and a voltage source; and an inductor connected to the collector of the second transistor and the voltage source, wherein a collector of the first transistor and the voltage source are short-circuited, and wherein an emitter of the second transistor and the ground are short-circuited.

13. The voltage-controlled oscillator according to claim 12, wherein the collector of the first transistor and the voltage source are connected through an inductor.

14. The voltage-controlled oscillator according to claim 12, wherein the emitter of the second transistor and the ground are connected through an inductor.

15. A voltage-controlled oscillator using a current feedback network, comprising:

an LC tank connected to a voltage source;

a first transistor having a collector connected to the LC tank;

a second transistor having a base connected to an emitter of the first transistor and a collector connected to a base of the first transistor and the LC tank;

a first capacitor connected to the emitter of the first transistor and a ground;

a first resistor connected to the emitter of the first transistor and the ground;

a first inductor connected to the emitter of the second transistor and the ground;

a third transistor having a collector connected to the LC tank;

a fourth transistor having a base connected to an emitter of the third transistor and a collector connected to a base of the third transistor and the LC tank;

a second capacitor connected to the emitter of the third transistor and a ground;

a second resistor connected to the emitter of the third transistor and the ground;

a second inductor connected to the emitter of the fourth transistor and the ground; and varactors connected to the collectors of the first transistor and the second transistor.

16. The voltage-controlled oscillator according to claim 15, wherein the LC tank comprises a first and second inductors connected to the voltage source, respectively, and a capacitor connected to the first and second inductors.

* * * * *